(12) United States Patent  
Peroulas et al.

(10) Patent No.: US 9,287,833 B2  
(45) Date of Patent: Mar. 15, 2016

(54) CAPTURE BUFFER OF DIGITAL PREDISTORTION SYSTEMS

(75) Inventors: James Peroulas, Saint Louis, MO (US); Aimin You, Shenzhen (CN); Qun Liao, Shenzhen (CN); Xiaowei Yan, Shenzhen (CN); Yiqun Mo, Shenzhen (CN); Zhaoquan Zeng, Shenzhen (CN)

(73) Assignees: ZTE Corporation, Shenzhen, Guangdong (CN); ZTE Wistron Telecom AB, Stockholm (SE)

( * ) Notice: Subject to any disclaimer, the term of this patent is extended or adjusted under 35 U.S.C. 154(b) by 722 days.

(21) Appl. No.: 14/348,411

(22) PCT Filed: Apr. 19, 2011

(86) PCT No.: PCT/CN2011/073027  
§ 371 (c)(1),  
(2), (4) Date: Mar. 28, 2014

(87) PCT Pub. No.: WO2011/131122  
PCT Pub. Date: Oct. 27, 2011

(65) Prior Publication Data  
US 2014/0333377 A1     Nov. 13, 2014

(30) Foreign Application Priority Data

Apr. 21, 2010    (WO) ................ PCT/CN2010/072008  
Jun. 18, 2010    (WO) ................ PCT/CN2010/074095

(51) Int. Cl.
| | | |
|---|---|---|
| H03F 1/32 | (2006.01) |
| H03F 3/195 | (2006.01) |
| H03F 3/24 | (2006.01) |
| H04L 27/36 | (2006.01) |

(52) U.S. Cl.  
CPC .............. *H03F 1/3247* (2013.01); *H03F 3/195* (2013.01); *H03F 3/24* (2013.01); *H04L 27/367* (2013.01); *H03F 2201/3227* (2013.01)

(58) Field of Classification Search  
CPC ............................ H03F 1/3241; H03F 1/3247  
USPC ........................................ 330/149; 455/114.3  
See application file for complete search history.

(56) References Cited

U.S. PATENT DOCUMENTS 7,746,167 B1 * 6/2010 Summerfield ................ 330/149  
2012/0032739 A1    2/2012 Peroulas et al.

FOREIGN PATENT DOCUMENTS

| CN | 101155158 | 4/2008 |
| CN | 101689839 | 3/2010 |
| WO | 2008078195 | 7/2008 |
| WO | 2010024952 | 3/2010 |

OTHER PUBLICATIONS

International Search Report for PCT/CN2011/073027, Completed by the Chinese Patent Office on Jul. 28, 2011, 3 Pages.

* cited by examiner

*Primary Examiner* — Steven J Mottola  
(74) *Attorney, Agent, or Firm* — Brooks Kushman P.C.

(57) ABSTRACT

An improved DPD system includes a predistortion module having at least one predistortion function. The predistortion module is configured to receive and subsequently process a baseband signal. The system also includes a power amplifier configured to receive the processed baseband signal from the predistortion module. The system further includes a model calculator configured to program priorities for predistortion functions so that the processed baseband signal transmitted from the predistortion module corresponds to the transmission power of the power amplifier. The model calculator is further configured to send a trigger signal to indicate when data capture from the power amplifier should begin so as to update the predistortion functions. A trigger module in the system is configured to receive the trigger signal and to initiate data capture from the power amplifier upon receipt of the trigger signal.

18 Claims, 5 Drawing Sheets

CAPTURE BUFFER OF DIGITAL PREDISTORTION SYSTEMS

CROSS-REFERENCE TO RELATED APPLICATION

This application is the U.S. national phase of PCT Application No. PCT/CN2011/073027 filed Apr. 19, 2011 which claims priority to PCT Application No. PCT/CN2010/072008 filed Apr. 21, 2010 and PCT/CN2010/074095 filed Jun. 18, 2010, the disclosures of which are incorporated in their entirety by reference herein.

FIELD OF THE DOCUMENT

The field of the document is digital predistortion (DPD) systems, and in particular, to an improved capture buffer (CB) which is often used in DPD systems.

BACKGROUND

DPD systems are often employed in communications system transmitters to allow a power amplifier to be driven into its non-linear region. In a typical DPD prior art system, a baseband signal is processed by a predistorter. The predistorter is a nonlinear device which creates a signal that is forwarded to the nonlinear power amplifier, such that the cascade of the nonlinear predistorter and the nonlinear power amplifier produces a system that is linear overall. Thus, the signal being sent from the nonlinear device to an antenna is simply a scaled up version of the signal that arrived from the baseband.

The baseband signal comes in and is sent through a total of $N_{pdf}$ predistortion functions. Power amplifiers typically have different characteristics at different transmission power levels. Hence, different predistortion functions are typically needed to correct power amplifier performance at different transmission power levels. The number of predistortion functions ($N_{pdf}$) depends on the power amplifier being used because different power amplifiers require a different number of predistortion functions. Each predistortion function is responsible for linearizing a power amplifier when the power amplifier is transmitting inside a specific transmission power range. For every possible average transmission power, there may be only a single predistortion function responsible for linearization.

The particular predistortion function that is used is determined by the actions of a power estimator, a slicer, and a multiplexer. The power estimator produces estimates of the baseband signal power or, in effect, the power amplifier's transmit power. The power estimates are forwarded to the slicer which examines the power estimate and determines which predistortion function is responsible for linearizing the power amplifier at that particular transmission power level. The input to the slicer is the current estimated power value and the output is a number between 1 and $N_{pdf}$ indicating which predistortion function should be used to predistort the power amplifier.

Often the characteristics of the power amplifier change with time and it is necessary to periodically update the characteristics of the predistorter. These periodic updates are under the control of a predistortion model calculator which first sends a signal to a capture buffer indicating that it should capture and record the data going into the power amplifier and the data coming out of the power amplifier. The capture buffer is rather simple and upon the receipt of a trigger signal, it begins blindly recording samples into its memory buffer until it has recorded the appropriate number of samples. The amount of data to record will vary based on different types and models of power amplifiers, but will typically be in the range of several thousand samples. After the capture buffer has finished capturing data, the predistortion model calculator reads the data from the memory buffer and then processes the data so as to update the predistortion functions.

The predistortion function that is updated is chosen based on the average power of the signal coming out of the power amplifier. The predistortion function which will be updated is the predistortion function which is responsible for linearizing the power amplifier at the power level that was measured on the output of the power amplifier.

A significant limitation with the prior art is that the trigger affects the capture of a random set of data. The trigger signal arrives at a random moment in time without any regard to the signal that is currently being sent through the power amplifier. For example, a power amplifier can often be linearized quite well when it is transmitting at a fixed average transmission power level for some time. If the transmission power level changes, after some time, it will also be possible to linearize the power amplifier at the new average transmission power level. However, during a change in transmission power from one level to another, there will be some time when the power amplifier's characteristics are transitioning from one power level to another. During these transient periods, the power amplifier behaves somewhat unpredictably and is rather difficult to linearize. Because of the random timing of the trigger signal, it is possible that the capture buffer will capture data during one of these transient periods. If data from one of these transient periods is used to update a predistortion function, that predistortion function will only be able to linearize data during a transition period. Therefore, if the power amplifier transmits data at a fixed transmission power, this predistortion function will not be able to linearize the power amplifier and poor performance will result.

For the purposes of further explanation, suppose that a power amplifier has been transmitting at a transmission power level of $P_{max}$ for a long period of time. Further suppose that the transmission power changes to $P_{max}$-5 dB and that this particular power amplifier takes 1 ms to reach its new steady state. If data is captured after the transmission power has been reduced, but before the power amplifier has reached its new steady state, the captured data would describe the performance of the power amplifier during this transient state and cannot be used to create a predistortion function. It would therefore be beneficial if a mechanism existed that could prevent the capture buffer from capturing transient data.

A further discrepancy with the prior art described above becomes apparent in a situation where the transmission power level may be stable for long periods of time, but the transmission power level can change abruptly for short periods of time. For example, in a lightly loaded WCDMA (Wideband Code Division Multiple Access) transmitter that supports a High Speed Downlink Power Amplifier (HSDPA), it is a regular occurrence that the power amplifier may transmit at a transmission power level of Pmax-10 dB for an extended period of time. If a mobile station is scheduled to receive a downlink transmission that is rather short in length, it is possible for the transmission power to suddenly jump to $P_{max}$ for a short amount of time (perhaps 2 ms) and then drop back down to $P_{max}$-10 dB after the transmission to the mobile station has been completed.

With a random trigger, the probability of capturing data while the power amplifier is transmitting at $P_{max}$ is very low. For example, if these 2 ms transmissions only appear once per second, the probability of capturing data while the power amplifier is transmitting at $P_{max}$ is only about 1 in 500. This is a problem because the predistortion functions need to be updated regularly as the power amplifier's characteristics change. If the predistortion function that is used at a transmission power of $P_{max}$ is not updated regularly, the power amplifier may slowly lose performance at that transmission power level resulting in a decreased capacity and increased adjacent channel interference.

Therefore, it would also be beneficial if a mechanism existed that would ensure that predistortion functions that have not been trained in a long time be properly updated, even if data to update these predistortion functions is difficult to find.

SUMMARY OF THE INVENTION

An aspect of the present document may be directed to an improved DPD system which includes a predistortion module comprising at least one predistortion function and configured to receive a baseband signal and configured to process the baseband signal. The system may also include a power amplifier configured to receive the processed baseband signal from the predistortion module. The system may further include a model calculator configured to program priorities for predistortion functions so that the processed baseband signal transmitted from the predistortion module corresponds to the transmission power of the power amplifier. The model calculator is also configured to send a trigger signal indicating when data capture from the power amplifier should begin so as to update the predistortion functions. A trigger module in the system is configured to receive the trigger signal and to initiate data capture from the power amplifier upon receipt of the trigger signal. The trigger module is further configured to send an advance trigger signal to a capture buffer to capture data from the power amplifier to be used by the model calculator in updating predistortion functions.

DETAILED DESCRIPTION OF EMBODIMENTS

Figure 1:
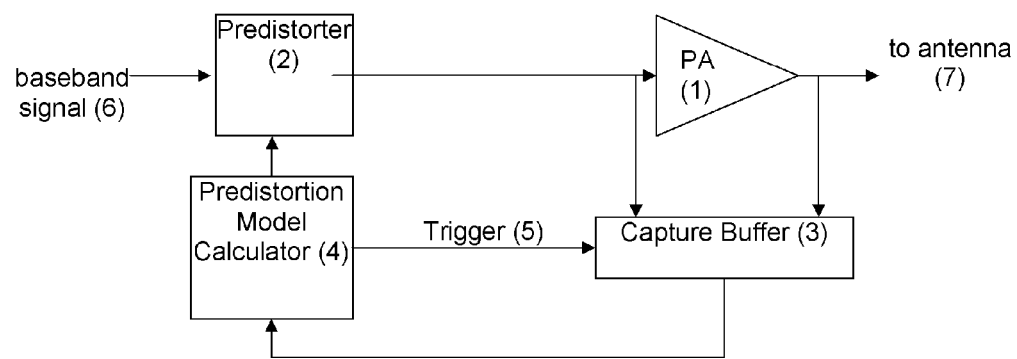
FIG. 1 illustrates an example of a typical digital predistortion (DPD) system as is known in the art.

Aspects of the present document are directed to an improved capture buffer used in digital predistortion (DPD) systems. In order to fully describe the embodiments of the invention, a known DPD system is illustrated in FIG. 1 and described below for a full understanding of the document. As is known to those skilled in the art, DPD systems are often employed in communications system transmitters to allow a non-linear power amplifier to be driven into its non-linear region. A baseband signal 6 is processed by a predistorter 2. The predistorter 2 creates a signal that is forwarded to the power amplifier 1.

Note that in FIG. 1, the power amplifier 1 is the so-called baseband representation of the power amplifier 1. It is known that in an actual communications system, the baseband signal going to the power amplifier 1 would be up-converted in frequency to the transmission medium's carrier frequency for transmission where it would be amplified by the power amplifier 1. Furthermore, to observe the output of the power amplifier 1, the output of the power amplifier 1 would be down-converted back to a baseband signal and then sampled. Because all of these operations, such as up-conversion, down-conversion, sampling, and D/A conversion, are not relevant to the description of this present document, the power amplifier 1 is modeled by its so-called baseband representation.

Figure 2:
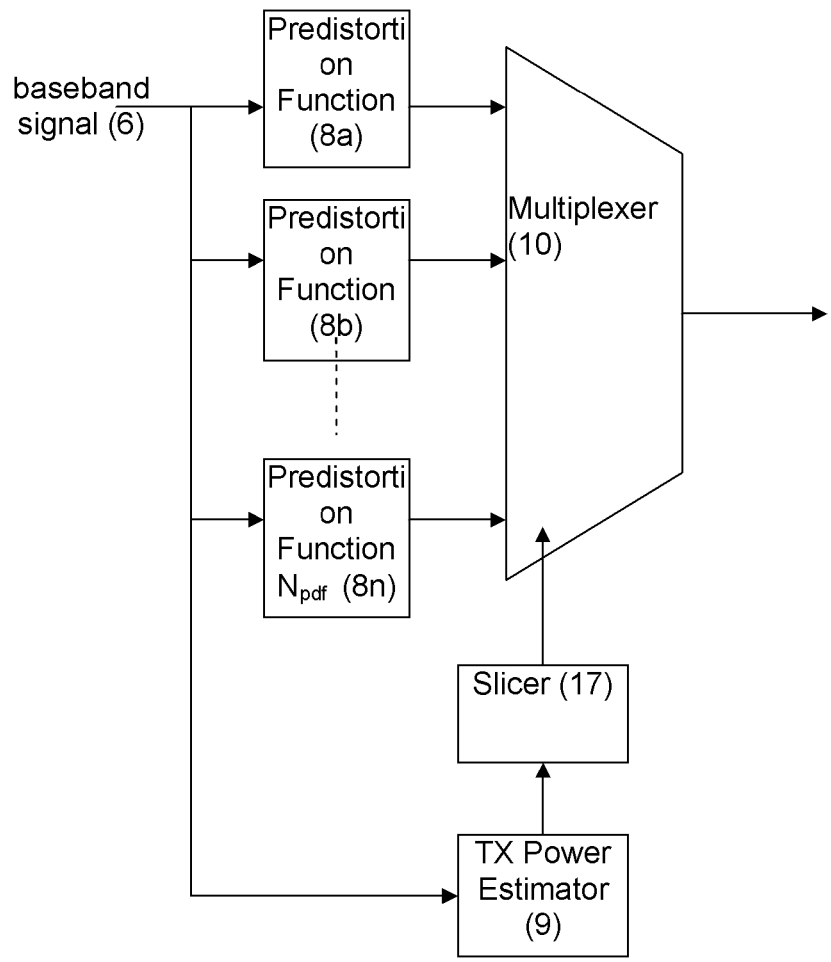
FIG. 2 illustrates a detailed representation of a predistorter as is known in the art, for use in known DPD systems.

FIG. 2 illustrates a detailed representation of a known predistorter 2. An incoming baseband signal 6 is sent through a total of $N_{pdf}$ predistortion functions 8. Because power amplifiers typically have different characteristics at different transmission power levels, different predistortion functions 8 are typically needed to correct power amplifier performance at different transmission power levels. For example, a first predistortion function 8a may be used to linearize the power amplifier 1 when the power amplifier 1 is transmitting at an average transmission power level greater than $P_{max}$-0.5 dB, where $P_{max}$ indicates the maximum average transmission power that the power amplifier 1 is expected to transmit. A second predistortion function 8b may be used to linearize the non-linear power amplifier 1 when it is transmitting at a power level between $P_{max}$-1.5 dB and $P_{max}$-0.5 dB.

Because different power amplifiers require a different number of predistortion functions, the number of used predistortion functions ($N_{pdf}$) depends on the power amplifier being used. For example, in a well-behaved non-linear power amplifier, a single predistortion function may be able to linearize the non-linear power amplifier through a wide range of average transmission power values. For example, a single function may be able to linearize a particular power amplifier model for all average transmission powers greater than $P_{max}$-4 dB. However, a different predistortion function may be required by the same power amplifier for average transmission powers between $P_{max}$-4 dB and $P_{max}$-8 dB. A different non-linear power amplifier model may not be so well behaved and may require predistortion functions for transmission power ranges spaced 1 dB apart. Thus, each predistortion function is responsible for linearizing the power amplifier when the power amplifier is transmitting within a specific transmission power range. Therefore, for every possible average transmission power, there will only be one predistortion function responsible for linearization.

The particular predistortion function 8 used is determined by the actions of a power estimator 9, a slicer 17, and a multiplexer 10. The power estimator 9 produces estimates of the baseband signal power or, in effect, the non-linear power amplifier's transmit power. Several algorithms are generally known that can be used to estimate the power of a signal. In one particular algorithm, the average of the square of the absolute value of several samples is computed. The number of samples to be averaged varies depending on the desired accuracy of the power estimator. In another algorithm, the square of the absolute value of the signal may be sent through an alpha filter which performs long term averaging. By adjusting the alpha value of the filter, more averaging can be used to produce more accurate estimates of the power of the signal.

The power estimates are forwarded to the slicer 17 which examines the power estimate and determines which predistortion function is responsible for linearizing the power amplifier 1 at that particular transmission power level. The input to the slicer 17 is the current estimated power value, and the output is a number between 1 and $N_{pdf}$, indicating which predistortion function 8 should be used to predistort the power amplifier 1.

Returning to FIG. 1, because the characteristics of the power amplifier 1 change with time, it is sometimes necessary to periodically update the characteristics of the predistorter 2. Thus, a predistortion model calculator 4 sends a signal to a capture buffer 3 indicating that the capture buffer 3 should capture and record data going into the power amplifier 1 and the data coming out of the power amplifier 1. Upon receipt of a trigger signal 5, the capture buffer 3 begins recording samples into its memory buffer until it has recorded an appropriate number of samples. The amount of data to record will vary based on different types and models of power amplifiers, but will typically be in the range of several thousand samples.

After the capture buffer 3 finishes the data capturing, the predistortion model calculator 4 reads the data from the memory buffer and processes the data so as to update the predistortion functions 8. Several algorithms exist whereby the captured data can be analyzed and used to update the predistortion functions 8. For example, a simple algorithm is a memory-less polynomial algorithm which models the power amplifier 1 as a memory-less nonlinear device. By analyzing the input and output data of the power amplifier 1, the predistortion model calculator 4 can calculate the nonlinear performance of the power amplifier 1 and then calculate an inverse mapping to counteract the nonlinear effects of the power amplifier 1. This inverse mapping is then used as a predistortion function 8.

The predistortion function 8 that is updated is chosen based on the average power of the signal coming out of the power amplifier. The predistortion function which will be updated is the predistortion function which is responsible for linearizing the power amplifier 1 at the power level that was measured on the output of the power amplifier. The predistortion model calculator 4 is often implemented as a digital signal processor and operates at a very slow rate. For instance, the sampling rate of the data going through the DPD system might be on the order of several 100 MHz. However, the predistortion model calculator 4 often operates at a speed that is many orders of magnitude slower than 100 MHz. Consequently, although the clock rate of the DSP may also be several 100 MHz, a single predistortion function update may take between 1 and 10 seconds to complete.

Figure 3:
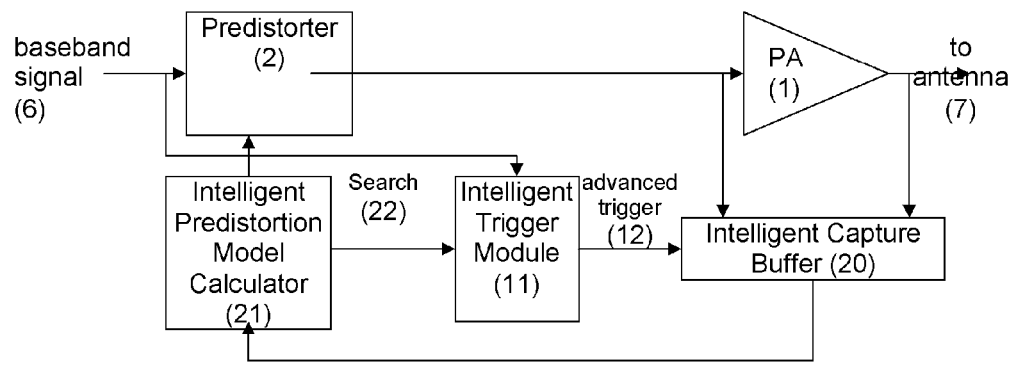
FIG. 3 illustrates an example of an improved DPD system.

FIG. 3 illustrates an example of a system that may be used to solve these limitations of the prior art DPD system. Similar to the system illustrated in FIG. 1, a baseband signal 6 is processed by a predistorter 2 which creates a signal which is sent to a power amplifier 1. Often, the characteristics of the power amplifier 1 change with time and it is necessary to periodically update the characteristics of the predistorter 2. When it is time to analyze power amplifier performance to update the predistorter 2, an intelligent predistortion model calculator 21 programs a set of priority codes and then sends a signal 22 to the intelligent trigger module 11 that it should begin to search for data to capture from the power amplifier 1. After data from the power amplifier 1 is successfully captured, the predistortion model calculator 21 processes the data so as to update predistortion functions that correspond to characteristics of the power amplifier 1.

The intelligent trigger module 11 may operate when the intelligent predistortion model calculator 21 indicates that a search should be performed though the use of the search signal 22. This signal may be, for example, an active high signal. If the intelligent predistortion model calculator 21 transmits the signal 22 which indicates to the intelligent trigger module 11 that the value for the search signal 22 is, for example TRUE, the intelligent trigger module 11 will begin searching for data to capture and will not stop searching for data to capture until it receives a value for the search signal 22 that is FALSE from the intelligent predistortion model calculator 21.

Therefore, in an aspect of the present document, when the received value for the search signal 22 is FALSE, the intelligent trigger module 11 becomes inactive and does not perform any new captures. Any data captures that were in progress when the value for the received search signal 22 changes from TRUE to FALSE are discarded, but any data captures that were successfully completed before the transition are retained.

Figure 4:
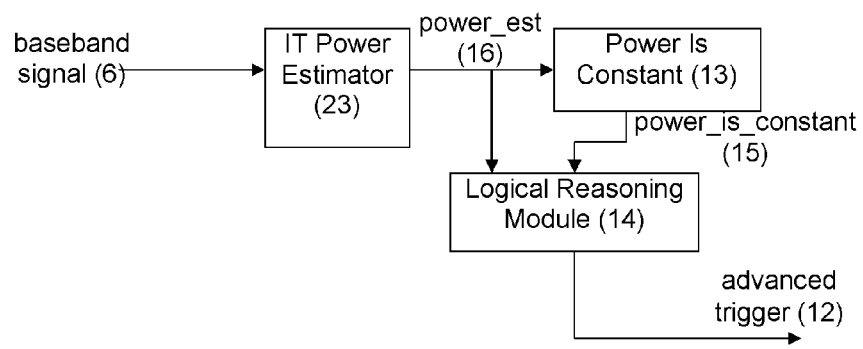
FIG. 4 illustrates an intelligent trigger module for use in a DPD system.

Referring to FIG. 4 illustrating an aspect of the intelligent trigger module 11, a baseband signal 6 is sent to a power estimator 23 which averages the instantaneous power of several samples so as to produce an estimate of the current transmission power 16 of the power amplifier 1 during each measurement period. The longer the measurement period ($T_{meas}$), the more accurate the power estimates, but also the longer amount of time that it will take to produce a new estimate of the transmission power 16. The actual length of the measurement period may be chosen by the designer of the system as a tradeoff between estimation accuracy and estimation delay.

In one aspect of the present document, the power estimator 23 is not allowed to average transmission power measurements between measurement periods. For every measurement period, the power estimator 23 produces a single estimate 16 that is independent of the estimates that it previously produced.

The estimate of the current transmission power 16 is sent to a power-is-constant module 13 which monitors the average power estimates. When the power-is-constant module 13 first begins searching, a power_is_constant signal 15 is initialized to a FALSE value. The power-is-constant module 13 waits for the first power estimate 16 from the transmission power estimator 23 and the power-is-constant module 13 initializes an average power signal to be equal to the value of the first power estimate 16. The power-is-constant module 13 then enters a main loop.

Inside this main loop, the power-is-constant module 13 waits for the next power estimate 16 to arrive from the power estimation module 23. The next power estimate value 16 is compared against the stored average power value to determine if the average signal power being sent through the power amplifier has changed significantly. This is done by the use of two constants, dep_high and dep_low. The dep_high and dep_low constants determine the highest estimated transmission power and the lowest estimated transmission power, respectively, that are allowed before the system considers that the transmission power is no longer being held constant. For example, if dep_high is set to 1.122 and dep_low is set to 0.891, the system will allow the estimated power to vary from the average power by up to 0.5 dB in either direction before it forces the value of power_is_constant value signal 15 to be FALSE.

If a single power estimate value is outside of the range determined by average power field, dep_high, and dep_low, the value of power_is_constant signal is set to FALSE, a counter is set to 0, and average power signal is re-initialized to the current power estimate. If the current power estimate value 16 is within the range determined by average power field, dep_high, and dep_low, the counter is increased by 1 and the value of the average power signal is updated according to the following equation:

$$\text{avg\_power} = \text{alpha} * \text{power\_est} + (1-\text{alpha}) * \text{avg\_power};  \quad \text{Eq. 1}$$

In other words, an alpha filter will be used to average the power estimate values 16 as they arrive from the power estimation module 23. The alpha parameter is chosen so as to allow a certain amount of variation in the average transmission power of the power amplifier 1 before the power_is_constant value signal 15 is forced to be FALSE. A low value of alpha will cause an average power value to change very slowly and thus, only very slow changes in average transmission power will be accepted before the value of the power_is_constant value signal 15 is forced to be FALSE. A large value of alpha will cause the average power value to change relatively quickly and will allow more rapid average transmission power changes before the value of the power_is_constant value signal 15 is forced to be FALSE.

The actual value of alpha is determined by the characteristics of the power amplifier and by the length of time the power amplifier takes to reach steady state when the transmission power changes. If the power amplifier 1 takes a long time to reach steady state, then a low value is used for alpha. If the power amplifier 1 reaches a steady state quickly, then a larger value of alpha may be used.

After the average power value is updated, the counter is checked to see if it is greater than or equal to the value of a pic_min_run_length field. If it is, the value of power_is_constant value signal 15 is set to TRUE which indicates that the power amplifier's transmission power has not changed significantly for at least pic_min_run_length $T_{meas}$ measurement periods. If the counter is less than pic_min_run_length, then this indicates that although the power amplifier's transmission power has been stable for several $T_{meas}$ measurement periods, not enough measurement periods have passed so as to consider the power amplifier to be in a steady state condition.

Therefore, the power-is-constant module 13 will continuously observe the power measurements and produce a signal 15 that indicates that the transmission power of the power amplifier has remained relatively constant for a reasonable amount of time. If the transmission power changes substantially, this module will immediately set the power_is_constant signal 15 to FALSE and wait for the transmission power to re-stabilize for a certain amount of time before it again sets the power_is_constant signal 15 to TRUE.

The parameters dep_high, dep_low, alpha, pic_min_run_length, and $T_{meas}$ are chosen and adjusted based on the actual power amplifier that is in use. As an example, a WCDMA power amplifier that recovers relatively quickly from rapid power changes may be able to use the following values: dep_high=1.122, dep_low=0.891, alpha=0.8, pic_min_run_length=3, and $T_m$=0.1 ms.

The value of the power_is_constant signal 15 is sent to a logical reasoning module 14 which decides when a capture should be initiated and whether the capture was completed successfully or not.

Figure 5:
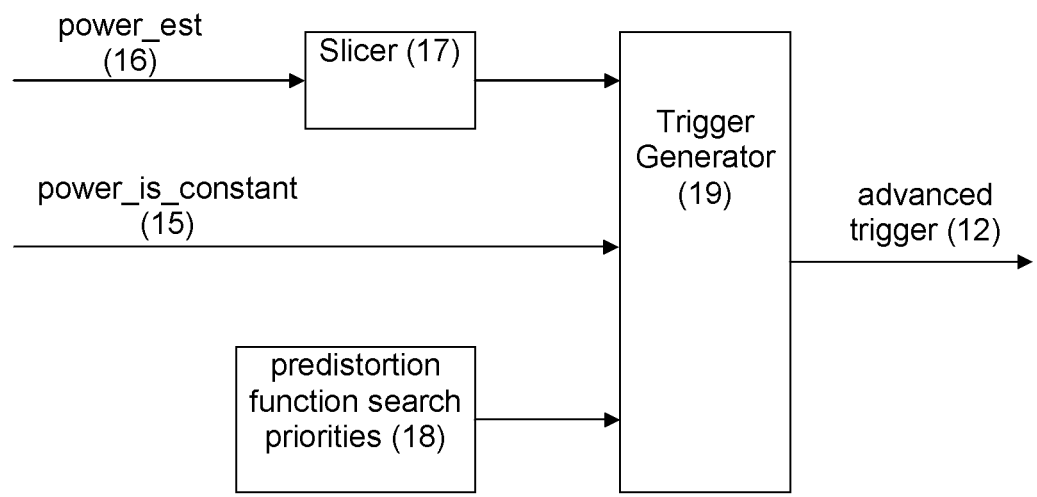
FIG. 5 illustrates a logical reasoning module for use in a DPD system.

FIG. 5 illustrates an example of a logical reasoning module. A power estimate signal 16 first goes through a slicer module 17 as described above. The output of the slicer module 17 indicates which predistortion function corresponds to the power level of the power estimate signal 16. For each predistortion function, a priority code is stored in a predistortion function search priority module 18. The priority codes stored in the predistortion function search priority module 18 indicate to a trigger generator 19 the priority code of each of the predistortion functions 8, and this information is used by the trigger generator 19 to decide whether to begin a capture or not.

According to aspects of the present document, before any capture can be initiated, the trigger generator 19 first checks to see if a power_is_constant signal 15 is set to TRUE. If this signal is TRUE, the trigger generator 19 then checks the priority code of the predistortion function that appears on the output of the slicer 17. If the priority code of the function on the output of the slicer 17 is higher than the priority code of the data currently stored in the holding buffer (or if the holding buffer is empty), an advanced trigger signal is sent to the capture buffer 20, shown in FIG. 3, to indicate that it should begin capturing data.

While the data is being captured, the power_is_constant value signal 15 is continuously monitored to ensure that it remains TRUE. If the value of the power_is_constant value signal 15 changes to FALSE during the capture, the captured data is discarded and the trigger generator 19 returns to its waiting state where it waits for the power_is_constant value signal 15 to become TRUE again.

After the data capture has been completed, the trigger generator 19 continues to monitor the power_is_constant value signal 15 for Mom seconds. Because of measurement errors and delays in the power estimation module 23, the transmission power of the power amplifier 1 may change. However, this change is not noted until slightly after the capture has been completed. By ensuring that power_is_constant value signal 15 remains TRUE for $T_{HOLD}$ seconds, one can ensure that the transmission power did not in fact change during any part of the capture.

If power_is_constant value signal 15 becomes FALSE before $T_{HOLD}$ seconds have elapsed, then the captured data is discarded and the trigger generator 19 again returns to its waiting state where it waits for the power_is_constant value signal 15 to become TRUE again. If the power_is_constant value signal 15 remains TRUE for the entire $T_{HOLD}$ period, this is considered a successful capture and the data stored in the capture buffer 20 is moved to the holding buffer. Furthermore, the priority code of the data stored in the holding buffer is also stored. The trigger generator 19 again returns to its waiting state where it waits for the power_is_constant value signal 15 to become TRUE again. Note that after a successful capture, a new capture will only be initiated if the power amplifier 1 starts transmitting at a power level whose predistortion function 8 has a priority code higher than the priority code of the data stored in the holding buffer.

For example, suppose that a DPD system is composed of three predistortion functions (8a, 8b, and 8c) that are responsible for predistortion for transmission power ranges [Inf, $P_{max}$-4 dB), [$P_{max}$-4 dB,$P_{max}$-8 dB), [$P_{max}$-8 dB,0] respectively where the notation [A,B) represents the range of values that are less than or equal to A and greater than B and the notation [A,B] represents the range of values that are less than or equal to A and greater than or equal to B. Furthermore, suppose that the priority codes of these predistortion functions are assigned the values 20, 10, and 15 respectively. Finally, suppose that the power amplifier is transmitting at a constant average power level of $P_{max}$-12 dB when a capture buffer search is initiated. Because at the moment of initiating a capture search the holding buffer is empty and the power_is_constant value signal 15 is set to TRUE, a capture will immediately begin and complete successfully. The priority code of the data stored in the holding buffer will be 15 because a transmission power level of $P_{max}$-12 dB corresponds to the third predistortion function 8c which has a priority code of 15.

Now, suppose that the transmission power changes to $P_{max}$-6 dB. The power_is_constant value signal 15 changes to FALSE for a period of time as determined by the pic_min_run_length but will shortly return to the value TRUE. The trigger generator 19 will notice the TRUE value on the power_is_constant value signal 15 and will consider initiating a new capture but will not do so because the priority code of the predistortion function that is used for a transmission power of $P_m$-6 dB is only 10, which is lower than the priority code of the data stored in the holding buffer. Effectively, the data stored in the holding buffer is of more interest than the data currently being transmitted through the power amplifier. Hence, the data currently being transmitted through the power amplifier 1 is ignored.

Finally, suppose that the transmission power changes one more time to $P_{max}$. Again, the power_is_constant value signal becomes FALSE for a period of time and again returns to TRUE. This time however, the trigger generator 19 will in fact initiate a new capture because the priority code of the predistortion function 8a that is used for a transmission power of $P_{max}$ is 20, which is higher than the priority code of the data stored in the holding buffer.

If the capture is completed successfully (i.e., power_is_constant value 15 is TRUE throughout the capture and for $T_{HOLD}$ seconds after the capture), the newly captured data will be copied to the holding buffer and the old data will be discarded. Effectively, the data being transmitted through the power amplifier 1 is of more interested than the data stored in the holding buffer. Hence, the new data will replace the old data. If, however, the capture is not completed successfully because the power_is_constant value 15 became FALSE, the holding buffer is not changed. Effectively, the data being transmitted through the power amplifier 1 was of more interest than the data stored in the holding buffer, but it was not possible to successfully capture the data. Hence, the data in the holding buffer is retained.

It should be noted that the priority codes of the different predistortion functions 8 are determined by the intelligent predistortion model calculator 21. One simple but effective priority code assignment strategy is to assign priority codes based on the amount of time that has elapsed since a particular predistortion function 8 was updated. The longer the amount of time since the last update, the higher the priority code of that predistortion function 8. When the system is first powered up, all of the predistortion functions 8 can be assigned a priority code of 0. Then, these priority codes can be updated as each predistortion function is updated, one at a time.

After a certain amount of time, the intelligent predistortion model calculator 21 sets the search signal to FALSE to indicate that searching should stop. It then examines the holding buffer to see if it contains valid data. Note that if the transmission of the power amplifier 1 is constantly changing, it is possible for the power_is_constant value signal 15 to never become TRUE and hence it is possible that data may never be captured. The intelligent predistortion model calculator 21 would then initiate a new search. If data is available, the intelligent predistortion model calculator 21 will read the data and calculate an updated predistortion function 8 as has been described in the prior art.

One advantage of the aspects of the present document is that data is not captured during a transient period in the power amplifier's behavior. For example, if the transmission power though the power amplifier is changing rapidly, no captures will be initiated until the average power amplifier transmission power has become stable for a certain period of time.

Furthermore, embodiments of the invention will be able to capture interesting data that appears on the power amplifier for a short period of time. For example, if the power amplifier has been transmitting using predistortion function 8a for a long period of time and suddenly transmits using predistortion function 8b for a short period of time, the embodiments of the invention will be able to react very rapidly and capture data to facilitate the update predistortion function 8b.

Figure 6:
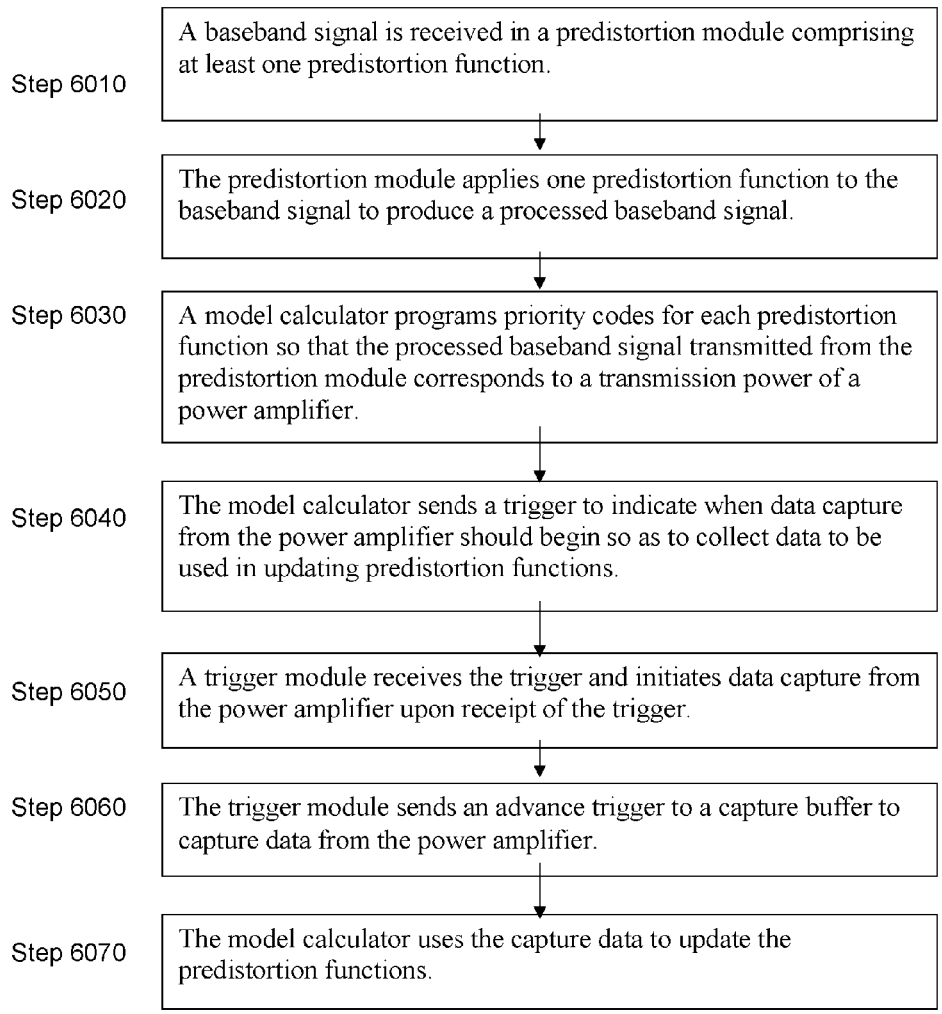
FIG. 6 illustrates processing steps implemented in a DPD system.

FIG. 6 illustrates the steps implements in an embodiment of the invention. In Step, 6010, a baseband signal is received in a predistortion module comprising at least one predistortion function. In Step 6020, the predistortion module applies one predistortion function to the baseband signal to produce a processed baseband signal. In Step 6030, a model calculator programs priority codes for each predistortion function so that the processed baseband signal transmitted from the predistortion module corresponds to a transmission power of a power amplifier. In Step 6040, the model calculator sends a trigger signal to indicate when data capture from the power amplifier should begin so as to collect data to be used in updating predistortion functions. In Step 6050, a trigger module receives the trigger signal and initiates data capture from the power amplifier upon receipt of the trigger signal. In Step 6060, the trigger module sends an advance trigger signal to a capture buffer to capture data from the power amplifier. In Step 6070, the model calculator uses the capture data to update the predistortion functions. The processed baseband signal transmitted from the predistortion module to the power amplifier corrects performance of the power amplifier at different transmission power levels.

While aspects of this document have been shown and described, it will be apparent to those skilled in the art that many more modifications are possible without departing from the inventive concepts herein. The patent document, therefore, is not to be restricted except in the spirit of the following claims.

What is claimed is:

1. A system, comprising:
    a predistortion module comprising at least one predistortion function, the predistortion module configured to:
        receive a baseband signal; and
        process the baseband signal;
    a power amplifier configured to receive one processed baseband signal;
    a model calculator configured to:
        program priorities for each of the at least one predistortion functions, and
        send a trigger signal; and
    a trigger module configured to:
        in response to receipt of the trigger signal, initiate data capture from the power amplifier, and
        send an advanced trigger signal to a capture buffer, wherein the capture buffer captures data from the power amplifier;
    wherein the trigger module is configured to continue a search of data to capture until it receives the trigger signal with a false value, preferably the trigger module is configured to discard data in the process of being captured when the false value for the trigger signal is received, more preferably the trigger module is further configured to retain data captured before the false value for the trigger signal is received.

2. The system of claim 1, wherein the each of the at least one predistortion functions is applied to the processed baseband signal;
    or
    the model calculator is configured to determine priority codes based on an elapsed time since a at least one predistortion function was last update.

3. The system of claim 1, wherein the trigger module comprises:
    a power estimator configured to produce a power estimate of a current transmission power of the power amplifier for each measurement period;

a power constant module configured to:
  determine whether there is a pre-determined level of change in an average power signal being sent through the power amplifier, and
  produce a constant value signal to either indicate that the transmission power of the power amplifier is constant for the pre-determined length of time or to indicate a pre-determined level of change in the transmission power over the pre-determined length of time; and
a logic module configured to:
  receive the constant value signal, and
  determine whether a data capture is to be initiated.

4. The system of claim 3, wherein the power estimator is further configured to produce the power estimate by averaging instantaneous power of at least two samples.

5. The system of claim 3, wherein the power constant module is configured to monitor the average power estimates by:
  initializing a power constant signal to a false value;
  initializing an average power signal to a first power estimate received from the power estimator; and
  entering a loop,
  wherein, in the loop, the power constant module is configured to:
    wait to receive a next power estimate value from the power estimator;
    compare the value of next power estimate to the value of the average power signal to determine if there is a predetermined level of change in the average power signal being sent through the power amplifier;
    if the next power estimate value is outside of a pre-defined range:
      set the power constant signal to a false value,
      set a counter to zero, and
      initialize the average power signal to the next power estimate value, or
    if the next power estimate value is within a predefined range:
      increase the counter value,
      update the value of the average power field,
      determine that the counter value is greater than or equal to a value of a predefined length field, and
      set the power constant signal to a true value to indicate that transmission power from the power amplifier has not changed for a predefined measurement period;
preferably the value of the average power signal is updated by applying an alpha filter to average power estimate values received from the power estimator, and wherein the alpha filter value is chosen so as to allow a certain type of variation in average transmission power from the power amplifier before the power constant signal is set to a false value; or the power constant module is configured to determine if there is a predetermined level of change in the average power signal by determining if the next power estimate is between a highest estimated transmission power and a lowest estimated transmission power, and wherein a transmission power is no longer considered to be constant if it is outside a range of the highest estimated transmission power and the lowest estimated transmission power.

6. The system of claim 3, wherein the logic module comprises:
  a slicer configured to:
    receive the power estimate from the power estimator, and
    output a signal indicating that the each of the at least one predistortion functions corresponds to the power level associated with the power estimate;
  a priority module configured to store a priority code for the each of the at least one predistortion functions, wherein the priority codes are used to determine whether to initiate data capture; and
  a trigger generator configured to:
    receive the priority code and the constant value signal, and
    determine whether to capture data from the power amplifier, based on the priority code and the constant value signal;
    preferably the trigger generator is configured to initiate data capturing upon determining that the value of the constant value signal is a true, and the priority code of the predistortion function is higher than the priority code of data currently stored in a holding buffer; or the trigger generator is configured to terminate data capturing upon determining that the value of the constant value signal is a false, and move to a waiting state until the value of the constant value signal becomes positive.

7. A method, comprising:
  receiving, by a predistortion module, a baseband signal, the predistortion module comprising at least one predistortion function;
  programming a priority code for each of the at least one predistortion functions so that the processed baseband signal transmitted from the predistortion module corresponds to a transmission power of a power amplifier;
  sending, by a model calculator, a trigger signal to indicate when to capture data from the power amplifier;
  in response to receiving the trigger signal at a trigger module, initiating data capture from the power amplifier;
  sending, by the trigger module, an advanced trigger signal to a capture buffer to capture data from the power amplifier; and
  using the captured data to update the at least one predistortion functions, wherein the at least one updated predistortion functions are periodically applied to the processed baseband signal transmitted to the power amplifier to correct performance of the power amplifier at different transmission power levels;
  wherein the initiating data capture comprises searching for data to capture until a trigger with a false value is received; preferably the initiating data capture comprises:
    discarding data in the process of being captured when a false value for the trigger is received, or retaining data captured before the false value for the trigger is received.

8. The method of claim 7, wherein each of the at least one predistortion functions is applied to the processed baseband signal.

9. The method of claim 7, wherein the initiating data capture comprises:
  receiving the baseband signal;
  producing an estimate of a current transmission power of the power amplifier for each measurement period;
  receiving the power estimate and monitoring average power estimates for a predetermined length of time to determine whether there is a pre-determined level of change in an average power signal being sent through the power amplifier;
  producing a constant value signal to either indicate that the transmission power of the power amplifier is relatively constant for the predetermined length of time or to indicate a pre-determined level of change in the transmission power over the predetermined length of time;
receiving the constant value signal;
determining whether the data capture is to be initiated; and
if the data capture is initiated, determining whether the data capture is successful.

10. The method of claim 9, wherein the producing an estimate of a current transmission power comprises producing the estimate by averaging instantaneous power of several samples.

11. The method of claim 9, wherein the monitoring average power estimates for a predetermined length of time comprises:
  initializing a power constant signal to a false value;
  initializing an average power signal to a first power estimate received from the power estimator; and
  entering a loop, wherein the loop comprises:
    waiting to receive a next power estimate value from the power estimator;
    comparing the value of the next power estimate to the value of the average power signal to determine if there is a predetermined level of change in the average power signal being sent through the power amplifier;
    if the next power estimate value is outside of a predefined range:
      setting the power constant signal to a false value;
      setting a counter to zero; and
      initializing the average power signal to the next power estimate value; or
    if the next power estimate is within a predefined range:
      increasing the counter value;
      updating the value of the average power field;
      determining that the counter value is greater than or equal to a value of a predefined length field; and
      setting the power constant signal to a true value to indicate that transmission power from the power amplifier has not changed for a predefined measurement period;
preferably the method further comprises: updating a value of the average power signal by applying an alpha filter to average power estimate values received from the power estimator, wherein the alpha filter value is chosen to allow a certain type of variation in average transmission power from the power amplifier before the power constant signal is set to a false value.

12. The method of claim 9, further comprising:
  determining if there is a predetermined level of change in the average power signal by determining if the next power estimate is between a highest estimated transmission power and a lowest estimated transmission power, wherein a transmission power is no longer considered to be constant if it is outside a range of the a highest estimated transmission power and the lowest estimated transmission power.

13. The method of claim 9, wherein the determining whether the data capture is to be initiated comprises:
  receiving the power estimate from the power estimator and outputting a signal which indicates the at least one predistortion functions corresponding to the power level of the power estimate;
  storing a priority code for each of the at least one predistortion functions, wherein the priority codes are used to determine whether to initiate the data capture; and
  using the priority code stored in the priority module and the constant value signal from the power constant module to determine whether or not to capture data from the power amplifier.

14. The method of claim 13, wherein the determining whether the data capture is to be initiated from the power amplifier comprises sending an advanced trigger signal to the capture buffer to initiate data capturing upon determining that:
  the value of the constancy signal is a true value, and
  that the priority code of the each of the at least one predistortion functions is higher than the priority code of data currently stored in a holding buffer;
preferably the determining whether to initiate the data capture from the power amplifier comprises:
  in response to determining that the constant value signal is a false value:
    sending an advanced trigger signal to the capture buffer to terminate data capturing, and
    moving to a waiting state until the value of the constant value signal becomes positive.

15. The method of claim 13, wherein, if a data capture is complete:
  moving stored data in the capture buffer to a holding buffer, and
  storing the priority code of the data in the holding buffer.

16. The method of claim 13, wherein the determining whether to initiate the data capture comprises:
  monitoring the constant value signal for a predetermined period of hold time after data capture is complete, wherein
  if the value of the constant value signal changes to a false value during the predetermined period of hold time:
    sending, by the trigger generator, the advanced trigger signal to the capture buffer to terminate data capturing; and
    moving to the waiting state until the value of the constant value signal becomes positive;
  or
  the determining whether to initiate the data capture comprises:
    in response to determining that a data capture is complete, initiating a new data capture process if the power amplifier begins to transit at a power level which the at least one predistortion function has a higher priority code than the data stored in a holding buffer.

17. An apparatus, comprising:
  means for receiving, by a predistortion module, a baseband signal, the predistortion module comprising at least one predistortion function;
  means for programming a priority code for the at least one predistortion function so that the processed baseband signal transmitted from the predistortion module corresponds to a transmission power of a power amplifier;
  means for sending, by a model calculator, a trigger signal to indicate when to capture data from the power amplifier;
  in response to receiving the trigger signal at a trigger module, means for initiating data capture from the power amplifier;
  means for sending, by the trigger module, an advanced trigger signal to a capture buffer to capture data from the power amplifier; and
  means for using the captured data to update the at least one predistortion functions, wherein the at least one updated predistortion functions are periodically applied to the processed baseband signal transmitted to the power amplifier to correct performance of the power amplifier at different transmission power levels;
  wherein the means for initiating data capture comprises means for searching for data to capture until a trigger with a false value is received; preferably the means for initiating data capture comprises:

means for discarding data in the process of being captured when a false value for the trigger is received, or means for retaining data captured before the false value for the trigger is received.

18. The apparatus of claim 17, further comprising means for applying the at least one predistortion function to the baseband signal to produce the processed baseband signal.

* * * * *